United States Patent

[11] 3,573,651

[72] Inventor Rudolf S. Engelbrecht
Bernardsville, N.J.
[21] Appl. No. 783,056
[22] Filed Dec. 11, 1968
[45] Patented Apr. 6, 1971
[73] Assignee Bell Telephone Laboratories Incorporated
Murray Hill, N.J.

[54] LOCKED OSCILLATOR ARRANGEMENT
8 Claims, 5 Drawing Figs.

[52] U.S. Cl. .......... 331/56, 331/107, 333/1.1, 333/10
[51] Int. Cl. .......... H03b 7/06
[50] Field of Search .......... 331/56, 107, 55; 333/10, 1.1

[56] References Cited
UNITED STATES PATENTS

| | | | |
|---|---|---|---|
| 3,310,725 | 3/1967 | Scarr et al. | 331/107 |
| 3,354,408 | 11/1967 | Crowell | 331/56 |
| 3,436,680 | 4/1969 | Hasty | 331/56 |
| 3,491,310 | 1/1970 | Hines | 331/107 |

*Primary Examiner*—John Kominski
*Attorneys*—R. J. Guenther and E. W. Adams, Jr.

ABSTRACT: A locked oscillator system is composed of a series array of modules each containing a unit oscillator in parallel with a bypass conductor and coupling means including a particularly adjusted phase shifter. Adjustment of the phase shifter in each module establishes the proportion of power that is directed to the unit oscillator device rather than to the bypass conductor of the next module. By appropriate adjustment of the phase shifters, equal synchronizing power is applied to each unit oscillator, and the remainder of the output power is applied directly to the load.

INVENTOR
R.S. ENGELBRECHT
BY Roy M. Porter Jr.
ATTORNEY

LOCKED OSCILLATOR ARRANGEMENT

BACKGROUND OF THE INVENTION

The present invention relates to locked oscillator arrangements and more particularly to a means for combining a large number of identical unit oscillators in a locked oscillator system having significant advantages over the prior art.

Solid-state devices such as transistors, Gunn-effect diodes and IMPATT diodes are more economical, reliable, and long lived than vacuum tube microwave oscillators The power currently available from a single solid-state microwave oscillator is limited, however, to approximately 1 watt continuous. Therefore, in applications requiring larger amounts of coherent, monochromatic microwave power derived from solid-state oscillators, it is necessary to phase lock a number of these devices together by application of a synchronizing signal. The two basic approaches to locked oscillator arrangements have been the series and parallel configurations.

A difficulty with past proposals for series combinations of several identical synchronized oscillators has been that, since the outputs combine in one direction, each successive oscillator sees a larger locking power than those preceding. (See FIG. 1A.) In later stages, the level of applied power can become large enough to seriously impair the desired performance, or even burn out the oscillators. This problem can be avoided by combining the oscillators in parallel with respect to the locking source through a suitable power fan-out and combining network. (See FIG. 1B.) However, this solution also has deficiencies. First, the system cannot be designed with an arbitrary number of oscillators; symmetry requires that oscillators be added in pairs. Second, because of the number of long interconnections necessary for the fan-out and combining networks, these parallel systems tend to be physically bulky.

SUMMARY OF THE INVENTION

The present invention concerns an improved method for combining the output of several locked or synchronized oscillators which eliminates the disadvantages of the prior art disclosures. The system herein disclosed involves a series array of oscillator modules each comprising a bypass conductor and an individual unit oscillator connected in parallel to the input terminals of a first directional coupler and a second coupler connected to the first by parallel conducting lines, one of which contains an adjustable phase shifter. (The phase shifter is one illustrative means for varying the relative phase angle of the signals in the parallel lines; the directional couplers are an illustrative means for combining two input signals having some relative phase angle into two output signals whose magnitudes are a function of that angle.) Adjustment of the phase shifter in a given module establishes the proportion of power that is directed to the oscillator device in the next module rather than to the next bypass conductor. The described system, therefore, permits the application of an identical synchronizing power to each individual oscillator, no matter what the size of the total output generated by the preceding oscillators. Furthermore, only the amount of power actually needed to perform the locking function is diverted; all the remainder bypasses the oscillator device. Therefore if, as is often the case, the necessary synchronizing power is only a few milliwatts whereas the output from the master and each unit oscillator is several hundred milliwatts, the present system permits the relatively small locking power to be taken from the output signal, leaving the rest to be transmitted directly to the output.

DETAILED DESCRIPTION

Figure 1B:
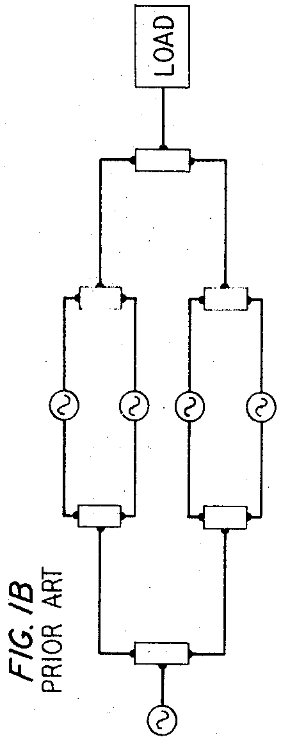
FIG. 1B PRIOR ART
FIGS. 1A and 1B are, respectively, schematic drawings of prior art series and parallel arrangements for combining the outputs from several synchronized oscillators.
Figure 1A:
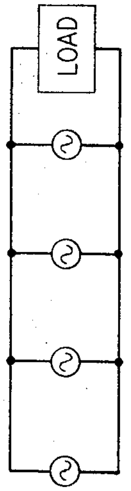
FIG. 1A PRIOR ART
Figure 2:
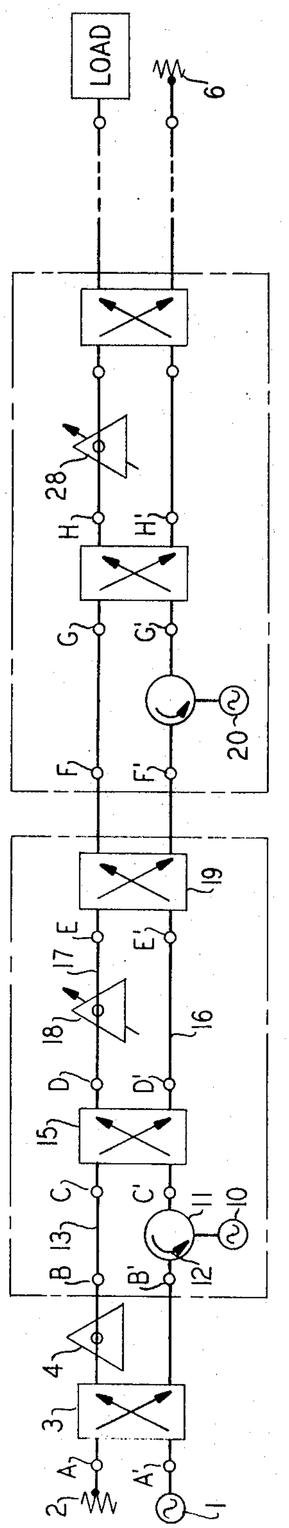
FIG. 2 is a schematic drawing of a circuit embodying the applicant's invention.
Figure 4:
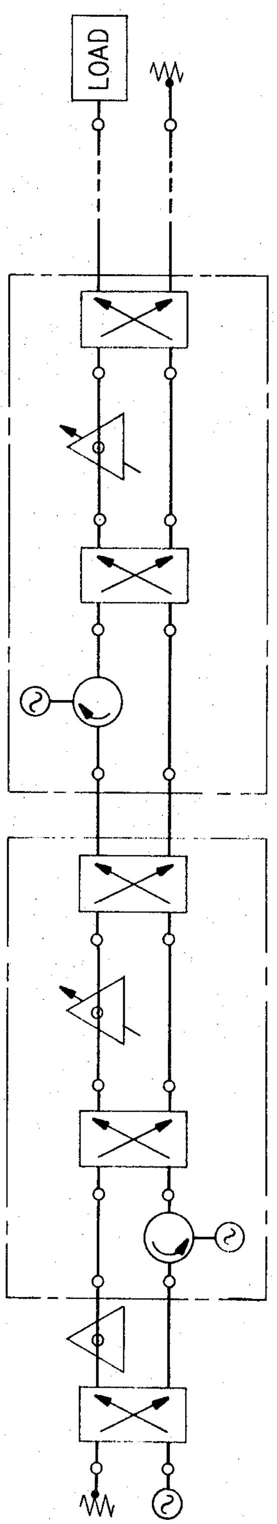
FIG. 4 is a schematic drawing of a further embodiment of the present invention.

Referring more specifically to FIG. 2, an illustrative embodiment of the present invention is shown with appropriate input and output circuitry and two identical series-arrayed modules. The individual unit oscillators typically are of the Gunn or IMPATT type, operating in the frequency range from 1 to 100 gigahertz, with individual output power on the order of 500 mw. and locking power on the order of 10 milliwatts. Referring for convenience to the first module only, the module is constructed as follows. Input terminals B and B′ are connected respectively to conductor 13 and the first port of three-port microwave circulator 11. The circulators shown in FIGS. 2 and 4 are one illustrative means for integrating the individual oscillators into the circuits. Other means, such as hybrid junctions, could be used to accomplish the same result with suitable modifications to the circuit. The circulator provides a sequential transmission of energy from port to port in the direction indicated by the curved arrow 12 and has individual unit oscillator 10 connected to its middle port. Conductor 13 and the final port of circulator 11 are connected respectively at terminals C and C′ to the inputs of a first 3 db. directional coupler 15. Coupler 15 is connected to second 3 db. directional coupler 19 by a lower path, conductor 16, and an equal length supper path, conductor 17, containing adjustable phase shifter 18.

The input circuitry consists of master oscillator 1 and dissipative termination 2, each connected to one input terminal of coupler 3 and 90 ° phase shifter 4 connected to the upper output port of coupler 3. The output circuitry consists of termination 6 and the load, each connected to one output port of the last module.

Figure 3:
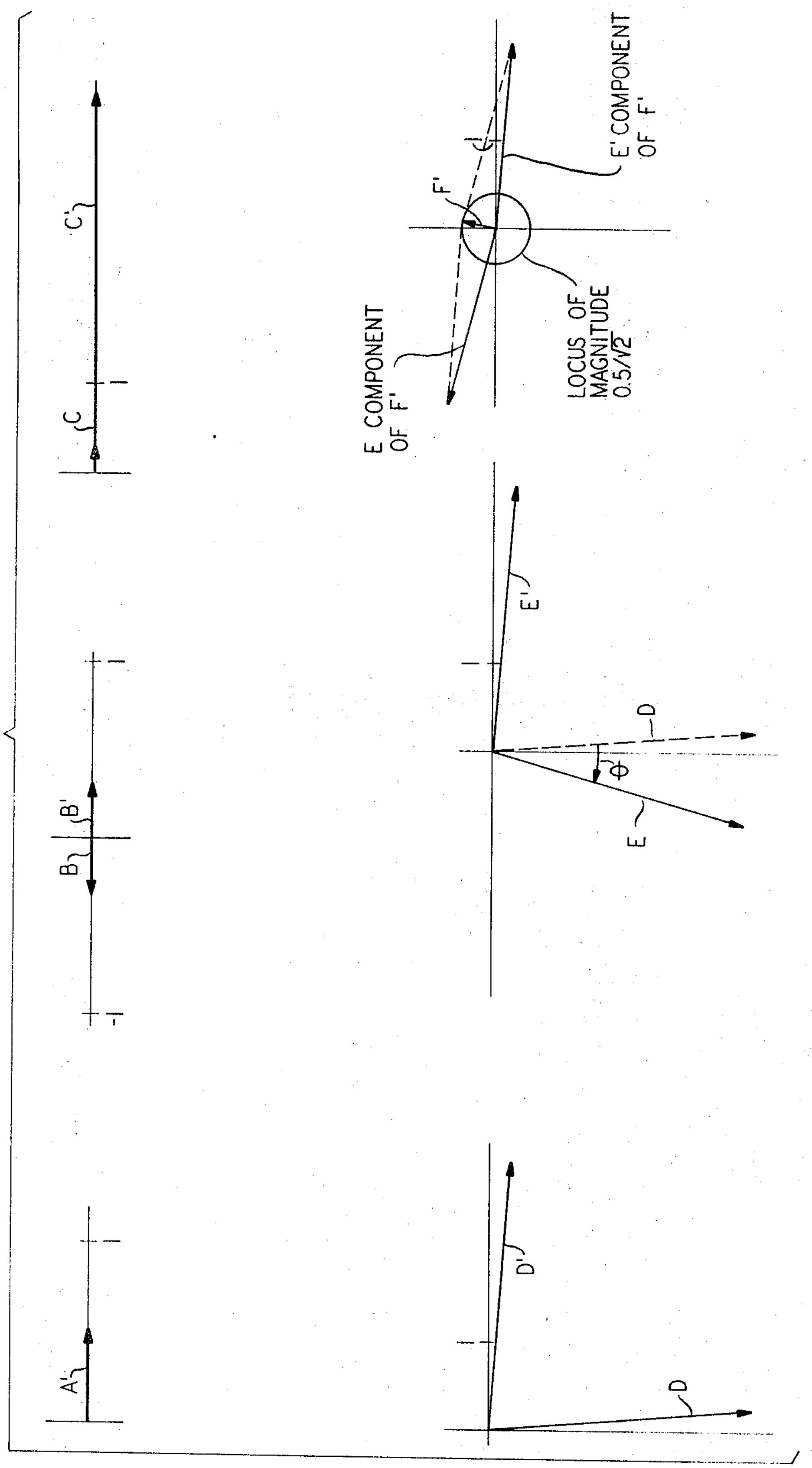
FIG. 3 is a graphical representation of the power present at designated points in FIG. 2 expressed vectorially.

The basic operation of the circuit of FIG. 2 can better be understood by further reference to FIG. 3, a vectorial representation of the voltage signals at indicated points in the circuit. The unit oscillator output voltages are represented as being four units in magnitude; the master oscillator voltage signal is chosen to be one-half unit in magnitude. The 0.5 volt locking signal from master oscillator 1 applied to input terminal A′ of coupler 3 is represented in FIG. 3 by the vector A′. It is chosen to have a phase angle of 0° and may, therefore, be written as $0.5\angle 0$.Coupler 3, in accordance with usual 3 db. coupler operation, produces voltage signals at its output ports having magnitudes of $0.5/\sqrt{2}$, with the phase angle of the signal in the upper branch lagging that in the lower branch by 90°. Phase shifter 4 then adds 90° more lag to the upper branch signal. If some other coupling means were used which produced a different relative phase angle, the setting of this phase shifter could readily to modified. The signals ultimately produced at terminals B and B′ are also pictured in FIG. 3. They can be written as follows: $B=0.5/\sqrt{2}\ \underline{\angle +180}$, $B'=0.5/\sqrt{2}\ \underline{\angle 0}$ The locking signal $0.5/\sqrt{2}\underline{\angle 0}$ from terminal B′ is applied to the frequency control section of individual oscillator 10. If the frequency of the synchronizing signal is equal to the natural frequency of oscillator 10, the output signal and the locking signal will combine in phase. (If the two frequencies were not equal, some phase difference would appear, up to 90° of difference at the extremes of the locking range.) Under these conditions, a voltage signal appears at terminal C′ of magnitude $4+0.5/\sqrt{2}$. The signal at terminal C′, it will be remembered, has a magnitude of $0.5/\sqrt{2}$.

The modules are designed so that equal power is emitted from the two output terminals of its first coupler, designated in the first module as D and D′. For these signals to be equal, the signals at input terminals C and C′ of first coupler 15 must have a relative phase difference of either 0° or 180°. If the phase difference of the signals at input terminals C and C′ is 0° or 180°, no matter what their relative magnitudes, it can be shown that the signals at output terminals D and D′ will have equal magnitudes.

As stated above, phase shifter 4 causes the voltage signal at terminal B to lag the voltage at terminal B' by 180°. Therefore the electrical path length from B to C and the electrical path length from B' to C' through circulator 11 and oscillator 10 must differ by 0° or 180°. If the B-to-C path is 180° different from the B'-to-C' path, the two signals will arrive at C and C' in phase; if the two paths are equal, the phase difference at C and C' will be 180°. In either case the phase relationship at C and C' will be proper to produce equal magnitude voltage signals at output terminals D and D'.

No phase shifter analogous to shifter 4 appears before any subsequent module. As will be explained below, the input signals to the bypass conductor and oscillator in each module after the first will have the requisite 0° or 180° relative phase angle so that if the electrical path lengths are equal, no additional relative phase shift is needed.

In accordance with the above explanations, vectors C and C' are shown in FIG. 3 having respective magnitudes of $0.5/\sqrt{2}$ and $4+0.5/\sqrt{2}$ units, and a relative phase difference of 0°. The voltage signal at C can be represented as $0.5/\sqrt{2}\ \angle\underline{0}$ the signal C' as $(4+0.5/\sqrt{2}\ \angle\underline{0}$ The action of coupler 15 produces D and D' vectors represented graphically in FIG. 3 and mathematically as follows:

$$D=C/\sqrt{2}\ \angle\underline{0};+C'/\sqrt{2}\ \angle\underline{-90}=0.25\angle\underline{0}+(2\sqrt{2}+0.25)\angle\underline{-90}$$

$$D'=C/\sqrt{2}\ \angle\underline{-90}+C'/\sqrt{2}\ \angle\underline{0}=0.25\angle\underline{-90}+(2\sqrt{2}+0.25)\angle\underline{0}$$

These are vectors equal in magnitude and having a relative phase angle of approximately 83°.

Path lengths between the output terminals D and D' of coupler 15 and the input terminals *E* and *E'* of coupler 19 are equal; however, an additional relative phase angle $\theta$ is introduced to the signal in the D-to-E path by variable phase shifter 18.

It will now be shown that this adjustable phase shifter 18 may be particularly set to produce any desired signal splitting ratio between the two input terminals F and F' of the next module, and that the voltages at those terminals will be in phase or 180° out of phase. That is, the phase difference between the signals at terminals E and E' can be altered by phase shifter 18 so that the power output from coupler 19 at terminal F', the synchronizing signal for oscillator 20, is zero or any fraction of the total power input to coupler 19. Furthermore, since the cancellation effect caused by the interaction of the coupler input voltage signals is nondissipative, nearly all the remaining fraction of the input power is directed to output terminal F. Only a small resistive loss occurs in each coupler.

The voltage signals appearing at input terminals E and E' of second coupler 19 may be expressed as follows, where $\theta$ represents the phase angle added by phase shifter 18:

$$E=D\angle\underline{\theta}=0.25\angle\underline{\theta}+(2\sqrt{2}+0.25)\angle\underline{\theta-90}$$

$$E'=D'=0.25\angle\underline{-90}+(2\sqrt{2}+0.25)\angle\underline{0}$$

It is required that the synchronizing voltage at the input terminal F' of the second module have a magnitude of $0.5/\sqrt{2}$ so that oscillator 20 will be locked by the same power as oscillator 10. Mathematically, the locking voltage vector F' and the bypass voltage vector F, may be expressed as follows:

$$F=E/\sqrt{2}\ \angle\underline{0}+E'/\sqrt{2}\ \angle\underline{-90}$$

$$F'=E'/\sqrt{2}\ \angle\underline{0}+E/\sqrt{2}\ \angle\underline{-90}$$

Substituting for vectors E and E' one gets:

$$F=0.25/\sqrt{2}\ \angle\underline{\theta}+(2+0.25/\sqrt{2})\ \angle\underline{\theta-90}$$
$$+0.25/\sqrt{2}\ \angle\underline{-180}+(2+0.25/\sqrt{2})\ \angle\underline{-90}$$

$$F'=0.25/\sqrt{2}\ \angle\underline{-90}+(2+0.25/\sqrt{2})\ \angle\underline{0}$$
$$+0.25/\sqrt{2}\ \angle\underline{\theta-90}+(2+0.25/\sqrt{2})\ \angle\underline{\theta-180}$$

The second equation is directly solvable trigonometrically or graphically for $\theta$ and produces, for the particular case shown, an angle of approximately −17°.

This result can be arrived at alternatively by use of the first equation since the magnitude of the bypass voltage vector F, representing the output from the first module, is known once the magnitude of voltage vector F' is set. The total power produced to this point in the circuit is the sum of two elements: the power from master oscillator 1 and the power from oscillator 10. The master oscillator contribution is equal to the square of the voltage signal at A', or 0.25 power units. Oscillator 10 adds 16 more power units (4 units of voltage, squared) for a total of 16.25. The power at F' is fixed at 0.25, so the power at F is 16, and the magnitude of voltage vector F is 16 or 4 units. Therefore, the equation of vector F in terms of $\theta$ is also available.

The graphical solution for $\theta$ shown in FIG. 3 is begun by inserting the component of vector F' contributed by the signal at E'. This is a vector at the same angle as vector E', but reduced in length by the factor $\sqrt{2}/2$ Then is drawn, from the tip of this vector, a circle of equal length. The points at which this circle intersects a circle of radius $0.5/\sqrt{2}$ drawn around the origin represent the two possible end points for the vector representing the locking signal F'. Vector subtraction then enables one to solve for the E component of vector F', and that component, phase shifted by +90° and increased in magnitude by the factor $\sqrt{2}$ to account for the effect of coupler 19, gives vector E. Finally, the angle between vector E and vector D is $\theta$.

It should be clear from this analysis that the signal at F' can be adjusted by the selection of angle $\theta$ to any magnitude between zero and a maximum represented by the sum of the signals strengths present at coupler 19 input terminals E and E'. It should also be clear that the process just described can be repeated as many times as required to obtain the necessary total output power, while the synchronizing power in each stage is held at a given magnitude no matter how large the total output from the preceding oscillators becomes. The smaller synchronizing signals are produced by combining the signals at the second coupler input in each module more and more nearly out of phase and the larger output signals to the succeeding oscillators, by combining those same signals more and more nearly in phase. Because the total power in the system will grow larger in succeeding modules, successive phase shifters, 18, 28, etc., must be adjusted to direct smaller portions of the total signal to the circulator and oscillator and larger portions to the oscillator bypass conductor of a given module. When the necessary number of stages has been added the output terminals of the final coupler are connected to resistive termination 6 and the load. The phase shifter in the final module is then adjusted to send all of the output power to the load.

It was stated above that no element corresponding to phase shifter 4 is necessary in modules other than the first, so long as the path length along the bypass conductor is made equal to or 180° different from the effective path length through the oscillator in each succeeding module. This assertion can be proven readily from the equations for vectors F and F'. Let the vector $V=0.25/\sqrt{2}\ \angle\underline{\theta}\ +(2+0.25/\sqrt{2}\ \angle\underline{\theta-90}$ and the vector $V'=0.25/\sqrt{2}\ \angle\underline{-180}+(2+0.25/\sqrt{2}\ \angle\underline{-90}$ These two vectors have different directions but equal magnitudes. Vectors F and F' can then be rewritten as follows: $F=V+V'$, $F'=V\ \angle\underline{+90}+V'\ \angle\underline{-90}$. It is apparent from these equations that vectors F and F' will always have a relative phase angle of 0° or 180°. If this is true, and if the effective path lengths are equal or are different by 180°, the signals at terminals G and G' will also be 0° or 180° out of phase, and therefore equal signals will appear as desired at H and H'. This result is not dependent on the particular size relationship between the signals at C and C' and continues to be valid for succeeding modules, provided only that equal effective path lengths exist through the branch containing the bypass conductor and the branch containing the oscillator.

It can be shown that, with the modular phase shifters 18, 28, etc., set for 0° shift, a signal in a given line in a first module appears completely in the opposite line in the next succeeding module. Conversely, a phase shift of 180° causes all the power in, for example, the oscillator bypass line of a first module in FIG. 2 to appear in the oscillator line of the next module. Furthermore, it is preferred to operate a phase shifter in the region near 0° rather than in the region near 180°, to make the circuit less frequency dependent. These three preceding statements explain the utility of the variation of the present invention appearing in FIG. 4. The embodiment of FIG. 4 differs from that of FIG. 2 only in the inversion of the oscillator placement in alternate modules. This variation, however, has certain advantages.

In either variation, as the output signal from preceding oscillators becomes large with respect t the signal contribution added by each individual oscillator, the power shunted by the oscillator bypass conductor of a given module will be much greater than that in the oscillator path of that module. But the requirement of constant synchronizing power can be met in these later stages only if nearly all of the circuit power travels in the oscillator bypass conductor of each module. To accomplish this result in the embodiment shown in FIG. 2, the phase shift added between each of these oscillators would have to be nearly 180°. Phase shifts near 0° would send the bulk of the circuit power from the oscillator bypass conductor of a first module to the oscillator of a second. The inversion of alternate oscillators shown in FIG. 3 solves this dilemma, allowing synchronizing power to be held constant at a small fraction of the total generated power with the modular phase shifters set near 0°.

The practical limitation on the number of stages that can be successively combined is dependent on the passive losses in the various branches of each stage, and particularly in those branches other than that containing the module oscillator since the bulk of the generated power will pass through them in the later stages. For example, if the passive loss from input to output per stage is 0.1 db. or 2.5 percent, the 10th individual oscillator would add only (1/10—.25/10) or 7.5 percent net power to the system, and the fortieth stage would add (1/40—.25/10) or 0 percent.

It should be understood that the embodiments herein described are merely illustrative of a small number of the many possible applications of the principles of the invention. For example, the adjustable phase shifters could be replaced by three-port circulators having adjustable shorts, or the couplers, by hybrid junctions. A third variation also feasible involves the use of two individual oscillators and a hybrid junction, in place of each circulator-oscillator combination in the illustrated embodiment, with suitable ancillary modifications to other parts of the circuit. Numerous and varied other arrangements also in accordance with the principles herein disclosed may readily be devised by those skilled in the art without departing from the spirit and scope of the invention.

I claim:

1. A high frequency power generation apparatus comprising:
- an initial oscillator and a plurality of intermediate oscillators connected in progression so that each intermediate oscillator in the progression generates a signal contribution to the output from preceding oscillators in response to a synchronizing signal received from a preceding oscillator;
- means for applying a portion of the output from the initial oscillator as a synchronizing signal to a first of the intermediate oscillators;
- means associated with the first intermediate oscillator for combining the contribution of that oscillator with the remainder of the output from the initial oscillator and for equally dividing the combination thereof between two paths; and
- means for combining the signals on the two paths to produce a first output comprising a synchronizing signal for the next oscillator succeeding in said progression and to produce a second output much larger than the first output comprising an output to succeeding oscillators.

2. A high frequency circuit for receiving two input signals of the same frequency but of different amplitudes and for deriving therefrom a first output signal containing the major portion of the power in both input signals and a second output signal containing a minor portion of the power in both input signals, the circuit including:
- a first four-branch power dividing network to which the two input signals are applied respectively to two of the branches;
- a second four-branch network having two of its branches connected respectively to receive the signals from the remaining two branches of the first network; and
- the second network including means for combining the received signals more nearly in phase than out of phase in a third of its branches to produce the first output signal and more nearly out of phase than in phase in a fourth of its branches to produce the second output signal.

3. A high frequency power generation apparatus comprising:
- a plurality of individual oscillators connected in progression so that each intermediate oscillator in the progression generates a signal contribution to the output from preceding oscillators in response to a synchronizing signal received from a preceding oscillator;
- circuit means associated with each of the intermediate oscillators for combining the individual contribution of that oscillator with the output from preceding oscillators to produce an output to succeeding oscillators larger than the output from preceding oscillators and a synchronizing signal for a succeeding oscillator, said circuit means comprising:
- a first means for equally dividing the individual contribution of that oscillator between two paths and for receiving and equally dividing the output from preceding oscillators between the two paths;
- and a second means for combining the signals on the two paths nearly out of phase to produce the synchronizing signal for a succeeding oscillator and nearly in phase to produce the output to succeeding oscillators.

4. An apparatus as defined in claim 3 wherein the circuit means includes:
- a first four-branch power dividing network having the individual contribution of its associated oscillator and the output from preceding oscillators applied respectively to two of its branches;
- and a second four-branch network having two of its branches connected respectively to receive the signals from the remaining two branches of the first network;
- the second network including means for combining the received signals more nearly out of phase than in phase in a third of its branches to produce the synchronizing signal and more nearly in phase than out of phase in a fourth of its branches to produce the output to succeeding oscillators.

5. An apparatus as described in claim 4 wherein the first network comprises a 3 decibel hybrid junction and wherein the second network comprises a 3 decibel hybrid junction having a phase shifter included in one of its two receiving branches.

6. An apparatus as described in claim 3 wherein the individual contribution and the output from preceding oscillators have a relative phase angle at their respective inputs to equal an integral number of half wavelengths.

7. A circuit as described in claim 2 wherein the two input signals have a relative phase angle at the two receiving branches of the first network equal to an integral number of half wavelengths.

8. A multiple source high frequency power combining circuit for receiving two input signals of the same frequency but of different amplitudes and for deriving therefrom a first output signal containing the major portion of the power in both input signals and a second output signal containing a minor portion of the power in both input signals, the circuit including:
- a first means for equally dividing a first of said input signals between two paths and for equally dividing the second of said input signals between the two paths;
- and a second means for combining the signals on said two paths nearly out of phase to produce said second output signal containing said minor portion and nearly in phase to produce said first output signal containing said major portion of the power in both input signals.